United States Patent [19]

Hsieh et al.

[11] Patent Number: 4,878,101
[45] Date of Patent: Oct. 31, 1989

[54] SINGLE TRANSISTOR CELL FOR ELECTRICALLY-ERASABLE PROGRAMMABLE READ-ONLY MEMORY AND ARRAY THEREOF

[76] Inventors: Ning Hsieh, 1573 Larkin Ave., San Jose, Calif. 95129; Clinton C. Kuo, 9639 Vista View Dr., Austin, Tex. 78750

[21] Appl. No.: 947,212

[22] Filed: Dec. 29, 1986

[51] Int. Cl.$^4$ ............................................. H01L 29/78
[52] U.S. Cl. ...................................... 357/23.5; 357/41; 365/185
[58] Field of Search ................. 365/185; 357/23.5, 54, 357/59, 41

[56] References Cited

U.S. PATENT DOCUMENTS

| | | | |
|---|---|---|---|
| 4,087,795 | 5/1978 | Rossler | 357/23.5 |
| 4,203,158 | 5/1980 | Frohman-Bentchkowsky et al. | 365/185 |
| 4,317,272 | 3/1982 | Kuo et al. | 29/571 |
| 4,451,905 | 5/1984 | Moyer | 365/185 |
| 4,486,769 | 12/1984 | Simko | 357/41 |
| 4,561,004 | 12/1985 | Kuo et al. | 357/23.5 |
| 4,577,215 | 3/1986 | Stewart et al. | 357/23.5 |
| 4,616,340 | 10/1986 | Hayashi et al. | 365/185 |
| 4,668,970 | 5/1987 | Yatsuda et al. | 357/23.5 |

OTHER PUBLICATIONS

"How Seeq . . . Densities", Electronics, Aug. 21, 1986, 53–56.
B. Cole, "The Exploding Rule in Memory", Electronics, Aug. 21, 1986, 47–52.

*Primary Examiner*—Joseph E. Clawson, Jr.

[57] ABSTRACT

A single transistor EEPROM cell utilizes a tunneling oxide erase mechanism in which the tunneling oxide overlies a portion of the channel region. In addition, an array of single transistor EEPROM cells having a layout which provides convenient byte-at-a-time erase and program operation is disclosed. Two bytes of the array along adjacent rows share a common source, which also forms the source of a pair of erase select transistors, one for each byte. The word lines/control gates of the two bytes form the gates of the two erase select transistors.

3 Claims, 5 Drawing Sheets

SINGLE TRANSISTOR CELL FOR ELECTRICALLY-ERASABLE PROGRAMMABLE READ-ONLY MEMORY AND ARRAY THEREOF

RELATED APPLICATIONS

This application is related to a co-pending application bearing Ser. No. 947,213, filed of even date herewith and assigned to the assignee of the present invention.

FIELD OF THE INVENTION

The present invention relates, in general, to electrically-erasable, programmable read-only memories (EEPROM's). More particularly, the invention relates to a single transistor cell for EEPROM's and to an array of such cells forming an EEPROM.

BACKGROUND OF THE INVENTION

An EEPROM cell varies the charge stored on a floating gate in order to vary the threshold voltage, $V_T$, of a floating gate-type MOS transistor comprising a source, a drain, the floating gate and a control gate. For present purposes, an EEPROM cell is said to be "erased" when the $V_T$ of the transistor is less than some predetermined switch point voltage, $V_{TSP}$. The cell is said to be "programmed" when the $V_T$ of the cell is greater than $V_{TSP}$. As is familiar, $V_{TSP}$ is chosen to be less than the positive supply voltage $V_{DD}$ in static arrays and is approximately equal to $V_{DD}$ in dynamic arrays. Making the charge stored on the floating gate more positive decreases the $V_T$ of the transistor and making the charge stored on the floating gate more negative increases the $V_T$ of the transistor. As is familiar, charge is added to or removed from the floating gate by tunneling, channel hot carrier injection, avalanche injection or other techniques.

Nearly every commercially successful EEPROM uses at least two transistors per cell. In addition to the floating gate-type device, a series select transistor is present in each cell to alleviate the problem of read errors caused by over-erasure. Because the erasure process is not self-limiting, it is likely that too much negative charge will be removed from (or positive charge added to) the floating gate when the cell is erased, rendering the $V_T$ of the transistor negative (in other words, making it a depletion-mode device). Without series select transistors used for read access, such depletion-mode devices cause read errors when any other cell on the shared bit-line is accessed.

The required use of select transistors in EEPROM's limits the desired increase in density of such devices. Therefore, attempts have been made to overcome this problem. U.S. Pat. No. 4,451,905 (hereinafter, the '905 patent) discloses an EEPROM cell and array using a single transistor design. The approach of the '905 patent is to add extra decoders and an extra (−5V) power supply outside of the array itself to ensure that read errors are avoided. This saves area in the array itself, but may require just as much added area in the extra decoders and power supply.

U.S. Pat. No. 4,317,272 (hereinafter, the '272 patent) discloses a two transistor EEPROM cell in which the two transistors are, to the greatest extent possible, merged together. This saves a certain amount of area, but is still limited to a two transistor design. U.S. Pat. No. 4,486,769 (hereinafter, the '769 patent) discloses what is apparently a single transistor EEPROM cell design. However, a complex triple poly (three layers of polysilicon) process, an additional bias electrode and four connections to each cell (as opposed to the more conventional three) are required by this design. No mention of a solution to the over-erasure problem is made in the '769 patent.

A further problem with prior EEPROM designs has been the necessity to erase and re-program large portions, typically at least an entire row, of an EEPROM array in order to change the value of one or two bytes therein. This makes such EEPROMs less attractive for applications such as parameter stores in automotive controllers and account balance stores in "smartcards".

SUMMARY OF THE INVENTION

Accordingly, it is an object of the present invention to provide an improved single transistor EEPROM cell and an array thereof.

It is a further object of the present invention to provide a single transistor EEPROM cell and an array thereof which is not subject to read errors caused by over-erasure of cells therein.

Yet a further object of the present invention is to provide an improved EEPROM array with a convenient byte-at-a-time program and erase mechanism.

These and other objects and advantages of the present invention are provided by an EEPROM cell comprising a semiconductor body predominantly of a first conductivity type; source and drain regions of a second conductivity type at a first face of said body, the source and drain regions being separated by a channel region of said first conductivity type; a floating gate formed of patterned conductive material overlying and isolated from said semiconductor body, the floating gate overlying said channel region; tunnel means for selectively providing a conduction path between said source region and said floating gate, said tunnel means being partially coextensive with said channel region; and a control gate formed of patterned conductive material overlying and isolated from said semiconductor body and said floating gate, the floating gate and the control gate being coextensive over the channel region.

These and other objects and advantages of the present invention will be apparent from the detailed description below taken together with the drawings.

DETAILED DESCRIPTION OF THE INVENTION

The following description involves the structure and function of an N-channel EEPROM cell and array. That is, the structures are fabricated in a semiconductor substrate which is of predominantly P-type conductivity with N-type regions therein forming the source and drain regions. Those skilled in the art will recognize that while this is, by far, the most common choice for EEPROM's, it is also possible to reverse the conductivities and fabricate a P-channel EEPROM array.

Figure 1:
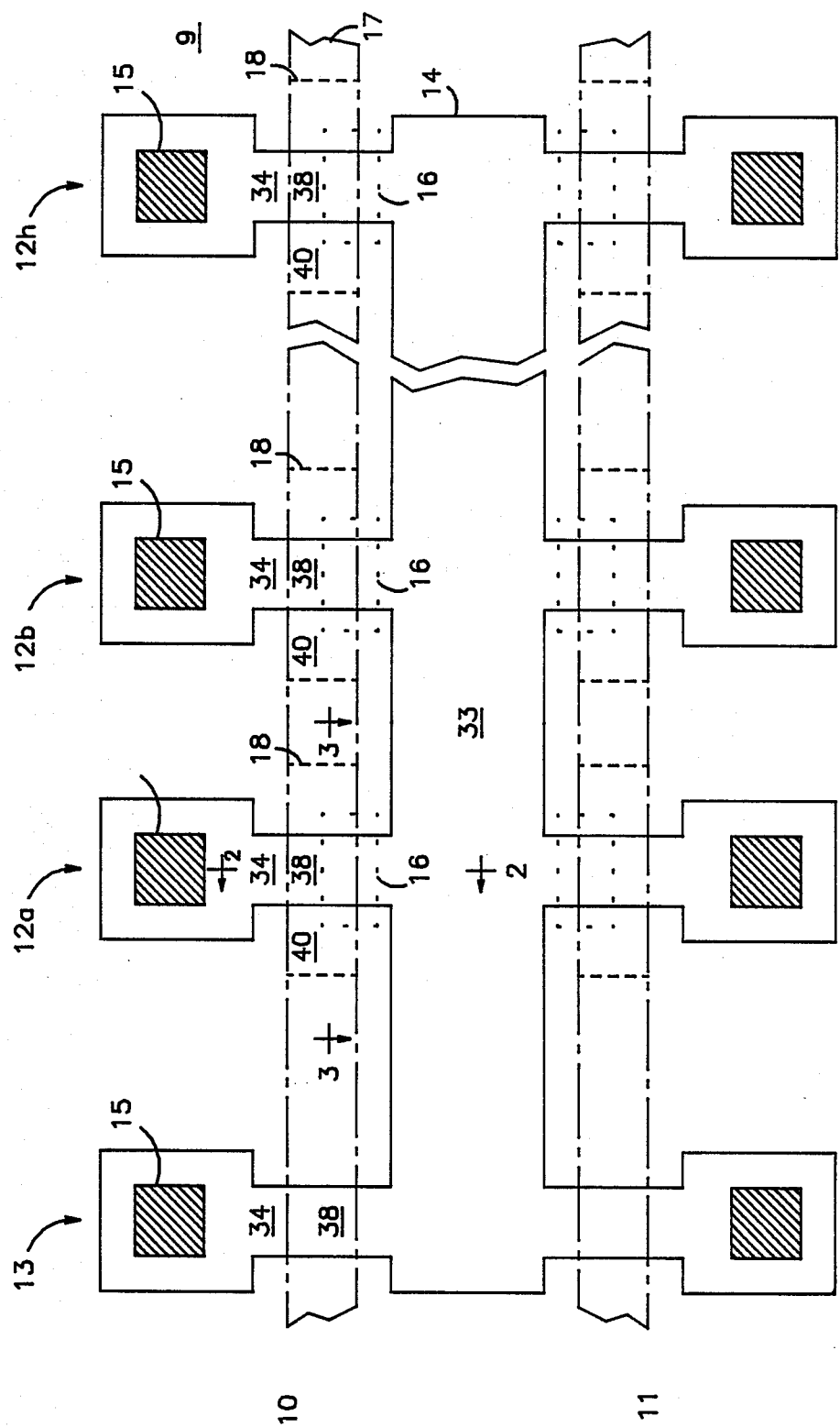
FIG. 1 is a plan view illustrating the layout of a single transistor EEPROM cell and a portion of an array thereof according to one aspect of the present invention.
Figure 2:
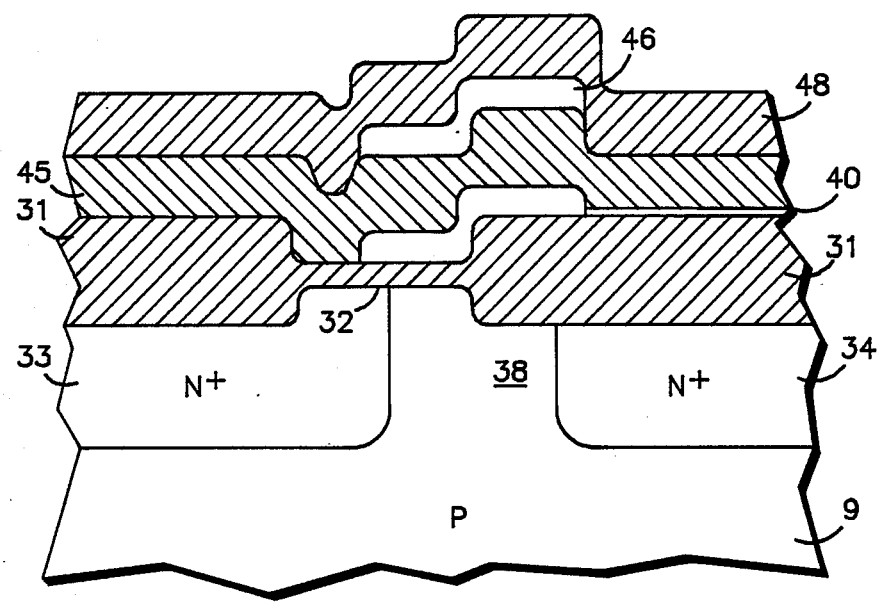
FIG. 2 is a cross-sectional view, taken along the indicated plane, of the device of FIG. 1.
Figure 3:
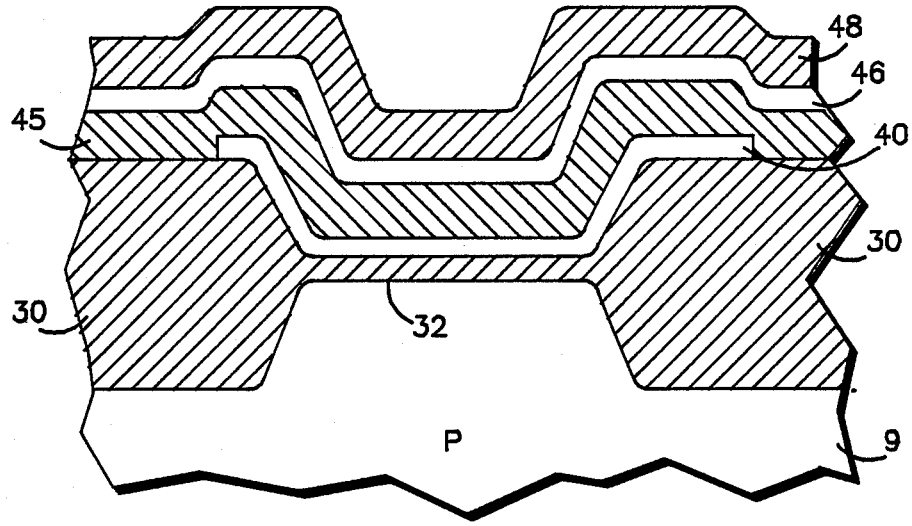
FIG. 3 is a cross-sectional view, taken along the indicated plane, of the device of FIG. 1.

FIGS. 1-3 illustrate, in various views as set forth above, the layout and structure of an EEPROM cell according to one aspect of the present invention. FIG. 1 is a conventional depiction of the geometric shapes which comprise the outlines of the various masks used to fabricate the device according to standard semiconductor industry practice.

FIG. 1 actually illustrates the layout of a portion of an EEPROM array comprising portions of two rows 10 and 11 thereof. The portions of rows 10 and 11 which are illustrated each comprise one byte (eight bits) of storage capacity. Since the two bytes are identical, only the byte along row 10 will be described in detail. The illustrated portion of row 10 comprises eight single transistor EEPROM cells 12a-12h (cells 12c-12g are not shown) and one erase select transistor 13.

First outline 14 defines the "active area" of the 18 transistors which comprise the two illustrated bytes. The surface of a P-type semiconductor substrate 9 outside of outline 14 is covered with a relatively thick (thousands of Angstroms) field oxide 30. In addition, common practice includes the formation of relatively heavily doped channel stop regions underlying all or part of field oxide 30. The surface inside outline 14 is covered by a relatively thin (hundreds of Angstroms) gate oxide 31, except for the surface inside outlines 15, which is exposed to allow contact with a metal interconnection line, and the surface inside outlines 16, which is covered by a very thin (on the order of 100 Angstroms) tunneling oxide layer 32. The formation of these oxide layers of varying thickness is performed according to techniques well known in the semiconductor industry.

In addition to defining the active region of the transistors, outline 14 defines the extent of the N-type diffusions or implants which form the sources 33 and drains 34 of each of the transistors. As is apparent, source 33 is shared between rows 10 and 11. Because source 33 is used for erase selection and because byte-at-a-time erasure is desired, source 33 is shared only by the two illustrated bytes, not by the entirety of rows 10 and 11. All of the area inside outline 14 is of N-type conductivity except for channel regions 38, which are defined as the areas of substrate 9 underlying the intersections of outlines 12 and 17. Alternatively, it is possible that some portions of the active region, particularly surrounding drains 34, may be lightly doped with a P-type dopant, typically by means of ion implantation, to enhance the programming mechanism.

Outlines 18 define the extent of floating gates 40. In fact, outlines 18 define the extent of the floating gates after a self-aligned etch which patterns the overlying control gates has been performed, not the actual mask which initially patterns the conductive material which forms the floating gates. Floating gates 40 overlie channel regions 38 of all transistors except erase select transistor 13. Floating gates 40 are fabricated according to familiar techniques by depositing and patterning a first conductive layer, most commonly a doped polysilicon layer, overlying oxides 30, 31 and 32. Stored charge on floating gates 40 is the source of the electric fields which alter the conductivity of channel regions 38 thus altering the threshold voltages of the transistors which comprise cells 12a-12h.

As is apparent, outlines 16, which define the extent of tunneling oxide 32, extend over portions of each channel region 38 on each of cells 12a-12h. This provides that a portion of each floating gate 40 is separated from a portion of source 33 only by tunneling oxide 32. Thus, if the proper voltage conditions are established, as is described in greater detail below, charge can be removed from floating gates 40 to source 33 by means of tunneling. This is the erase mechanism for cells 12a-12h.

Immediately overlying floating gates 40 is a layer of dielectric material 45. Dielectric material 45 serves to electrically isolate floating gates 40 from any overlying conductive material. Dielectric 45 may be a deposited dielectric, such as CVD oxide or an oxide-nitride-oxide (ONO) multi-layer structure. It is also possible that dielectric 45 can be formed by thermally oxidizing the polysilicon of floating gates 40.

Outline 17 defines the pattern of a second layer of conductive material, commonly another layer of doped polysilicon, which overlies dielectric material 45 and forms control gates 46. Outline 17 may also be referred to as defining the word lines which extend across the entire array and define the rows thereof. Control gates 46, as is familiar, serve to influence the potential of floating gates 40, respectively, during the programming and erasing of the cells and as the select gates during the reading of the cell. In the case of erase select transistor 13, control gate 46 is the sole gate of the transistor. The portion of control gates 46 which overlie floating gates 40 are co-extensive therewith. That is, there is no portion of channel regions 38 which is not overlain by both a floating gate and a control gate.

Immediately overlying control gates 46 is a second layer 48 of dielectric material which is similar to dielectric layer 45. Dielectric layer 48 serves to electrically isolate control gates 46 from overlying conductive layers such as metal lines and, of course, is opened where electrical contact thereto is required.

Each single transistor EEPROM cell 12a-12h as described above may be characterized as having "merged" tunneling and channel regions. That is, instead of having the floating gates of each cell extend outside of the immediate vicinity of the channel region to a separate area in which the tunneling mechanism is provided, the tunnel oxide region and channel region are partially merged. This layout conserves area, making the cell and the array smaller.

Figure 4:
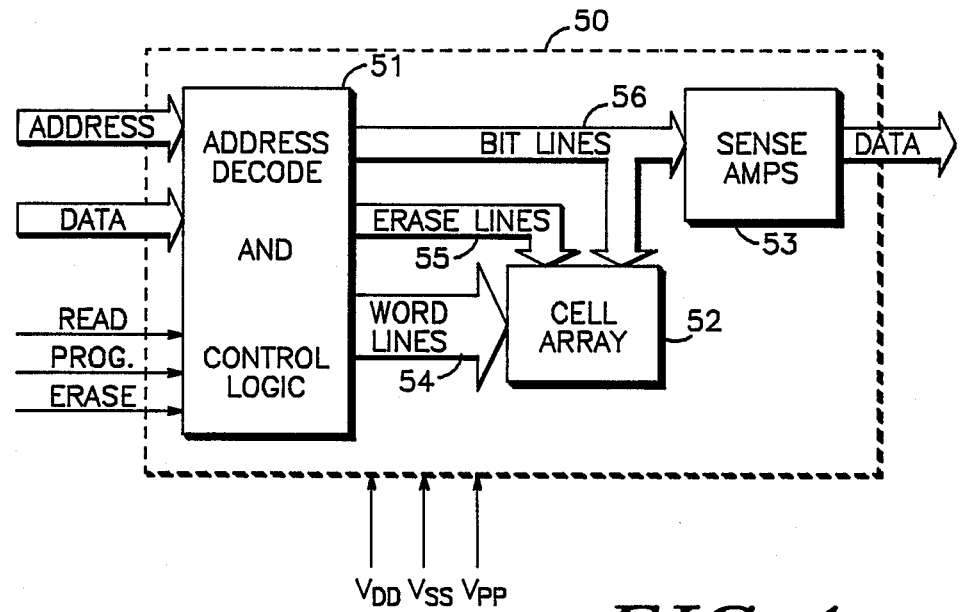
FIG. 4 is a simplified schematic illustration of an EEPROM according to one aspect of the present invention.

The function of an array of EEPROM cells such as just been described structurally with reference to FIGS. 1-3 may be better understood by first considering FIG. 4, which depicts, in greatly simplified block diagram form, an EEPROM 50. EEPROM 50 is a hypothetical device which accepts a predetermined number of address bits, a predetermined number of data bits, three control signals (READ, PROGRAM and ERASE) and three power supply voltages ($V_{DD}$, $V_{PP}$ and $V_{SS}$) as inputs and provides a predetermined number of data bits as outputs. Typically, $V_{DD}$ is approximately +5V, $V_{PP}$ is approximately +12V to +20V and $V_{SS}$ is ground, or 0V.

Internally, EEPROM 50 comprises address decode and control logic 51, an array 52 of EEPROM cells, a plurality of sense amplifiers 53, a plurality of word lines 54 which couple control logic 51 to array 52, a plurality of erase lines 55 which couple control logic 51 to array 52 and a plurality of bit lines 56 which couple array 52 to control logic 51 and to sense amplifiers 53. Addresses are decoded in logic 51 to provide the identity of the particular word line being addressed (X-decoded) and to provide the identity of the particular set of bit lines (or column) being addressed (Y-decoded). As is described in greater detail below, the decoding is followed by applying signals to array 52 over word lines 54, erase lines 55 and/or bit lines 56 as are appropriate to the operation specified by the control signals applied to logic 51.

Figure 5:
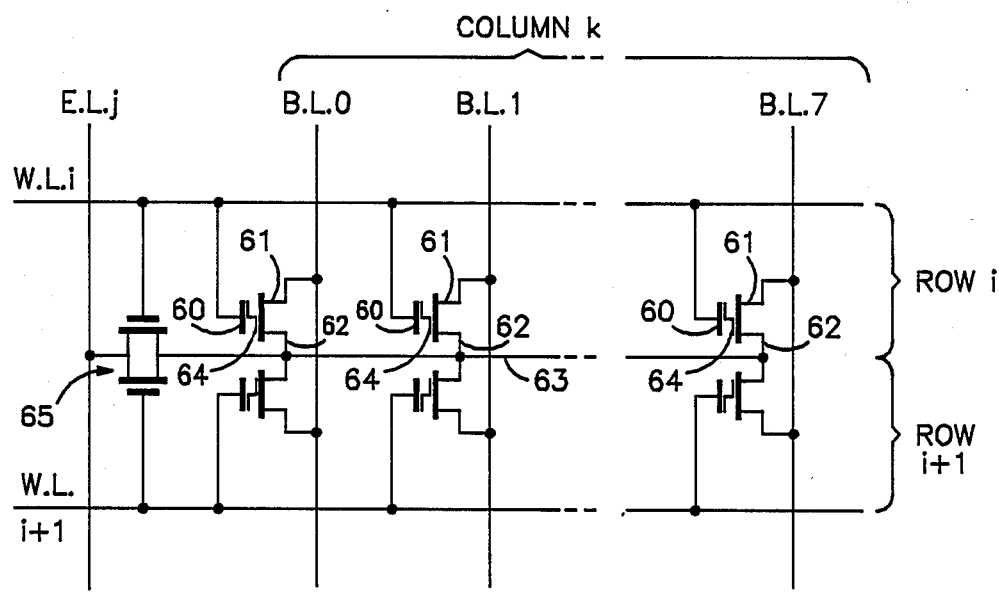
FIG. 5 is a detailed schematic illustration of a portion of an EEPROM array according to one aspect of the present invention.

FIG. 5 illustrates portions of a pair of rows (row i and row i+1) of cell array 52 of FIG. 5. FIG. 5 illustrates a preferred embodiment of the present invention in which the cells are organized so as to be conveniently erased one byte at a time. this byte-erasure scheme provides the ability to alter parameters stored in an EEPROM without suffering the overhead involved in reading, then re-programming an entire row or even larger unit of the array. Activities such as changing an account balance stored in an EEPROM on a "smartcard" are examples of the need for such a scheme.

FIG. 5 illustrates just one byte (comprising column k of array 52) along each of rows i and i+1. As is familiar in the art, each row extends across the entire width of array 52 and has more than one byte along its length. The interconnections to row i, column k of the array are word line i, erase line j and bit lines 0-7. Erase line j, in the preferred embodiment, is Y-decoded along with bit lines 0-7, and is shared by all rows in column k. Word lines i and i+1, on the other hand, extend across the entire width of the array and are shared by all the the columns thereof.

Each of the eight cells comprising row i, column k of the array comprises a floating gate-type N-channel transistor as is described above. Each transistor comprises a control gate 60, a drain 61, a source 62 and a floating gate 64. Control gates 60 are each connected to word line i, drains 61 are each connected to one of bit lines 0-7, respectively, and sources 62 are each connected to a common source/erase control line 63. In addition, each floating gate 64 is selectively coupled, during erase cycles, by tunneling to common source/erase control line 63. Common source/erase control line 63 is shared by each cell in column k along rows i and i+1, but does not extend into column k+1. This arrangement provides the desired byte-at-a-time erase and program features. If only row-at-a-time erase and program is desired, then common source/erase control line 63 may be extended across the entire width of the array and only one erase line would be required. Common source/erase control line 63 is connected to a source of an N-channel, enhancement-type erase select transistor 65. The gate of transistor 65 is connected to word line i and the drain is connected to erase line j. As is apparent to one skilled in the art, the circuit of FIG. 5 corresponds to the layout of FIG. 1.

Figure 6B:
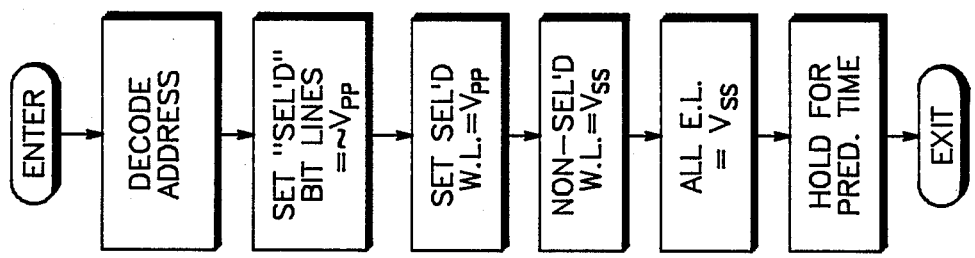
FIGS. 6A–6C are flow charts illustrating the operation of an EEPROM array according to one aspect of the present invention.
Figure 6A:
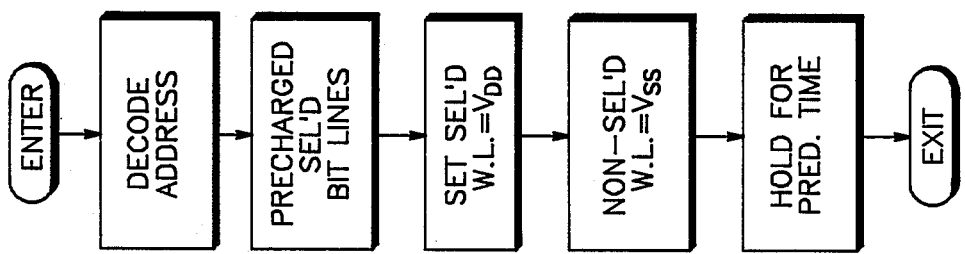
Figure 6C:
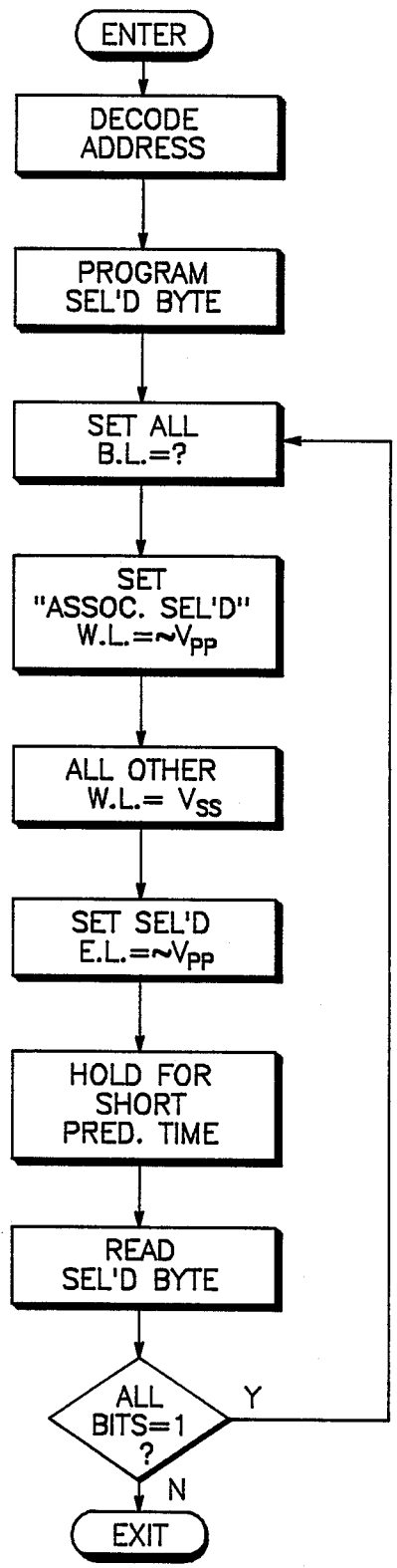

Reading, programming and erasing the EEPROM described with reference to FIGS. 4 and 5 are all accomplished, in some sense, one byte at a time. FIGS. 6A, 6B and 6C are flow charts illustrating the read, program and erase sequences, respectively. In practice, as will be apparent to one skilled in the art, the sequences illustrated may not be as linear as is implied by a flow chart representation. In other words, events represented as occuring sequentially may, in fact, occur simultaneously.

Referring to FIG. 6A, a read sequence for the above-described EEPROM is illustrated. References to structural elements will be with respect to FIGS. 4 and 5. First, logic 51 responds to the assertion of the READ control signal by decoding the address on the address bus. This results in the identification of the word line, i, which corresponds to the row of the array to be read and of the particular set of bit lines 0-7 comprising the column, k, which is to be read. In the case of a dynamic array, all bit lines have been precharged to a voltage level of approximately $V_{DD}$ prior to the read cycle. After the precharging is terminated, the selected word line, i, is set to approximately $V_{DD}$ and all non-selected word lines are set to $V_{SS}$. Static operation, in which no precharging of the selected bit lines is performed, is also possible.

Setting the selected word line to $V_{DD}$ both raises the control gates of each of the cells on the word line to $V_{DD}$ and "turns on" the N-channel erase select transistor (e.g. 65 of FIG. 5) through which each cell's source 62 is coupled to erase line j. All erase lines are at $V_{SS}$, providing a path to ground for the charge on the bit lines. Once the path to ground has been provided, those cells which have been previously erased, thus lowering their $V_T$'s to a value below $V_{TSP}$, will discharge their associated bit lines, which is sensed by the associated sense amplifier. Cells which have been previously programmed, thus having $V_T$'s above $V_{DD}$, will not significantly discharge their associated bit lines. The read configuration is held for a time predetermined to allow accurate reading of the array, then the read sequence is terminated.

FIG. 6B illustrates a program sequence for the above-described EEPROM. Logic 51 responds to the assertion of the PROGRAM control signal by first decoding the address to determine the identity of the selected row and column, i and k, respectively. Since a data word to be stored in row i of array 52 will typically be a combination of high and low logic values, programming must be responsive to the value of the data word received to determine which bits within the selected column are to be programmed. In the case of pre-programming preparatory to erasing (see below) all bits within the selected column will be programmed. Otherwise, data from the data bus will be used to determined which bits are to be programmed and which are not. For this reason, FIG. 6B indicates that the "selected" bit lines are set to approximately $V_{PP}$. This indicates that the bit lines must both be selected by the Y-decode process and must correspond to a bit in the input data word with the appropriate value.

In order, for instance, to program the cell at the intersection of word line i and bit line O, first bit line O is set to approximately $V_{PP}$. Then the selected word line, i, is set to approximately $V_{PP}$. In both cases, the actual voltage applied may be slightly lower than $V_{PP}$ due to threshold voltage drops through the intervening circuits. It is advantageous to design the circuits such that the actual voltage applied to the bit line is lower than the actual voltage applied to the control gate, or word line. This provides the proper electric field to cause electrons to move toward the floating gate. Non-selected word lines are set to $V_{SS}$. All erase lines are set to $V_{SS}$, thus creating a large voltage drop from drain to source in the cell being programmed. This condition, combined with the large positive voltage on the selected control gate, serves to inject electrons into the selected floating gate, leaving it with a more negative charge and raising the $V_T$ of the cell.

In programming an EEPROM cell, the minimum length of time necessary to inject sufficient charge onto the floating gate to raise the cell threshold voltage to the desired level is not easily predictable. Processing variations cause the required programming time to change from device to device and even between cells on a single device. One common technique is simply to hold the programming voltage levels in place for a length of time sufficient to ensure that the $V_T$ of the "worst case" cell is raised above $V_{TSP}$. Another well known sequence involves repeated, shorter write cycles with intervening read cycles, under the control of an outside processor or the internal control logic. When the target cell or cells read as programmed, then one or more "extra" program cycles are executed to provide a margin, and the process is terminated. In any case, a normal program sequence will be terminated when the $V_T$'s of the target cells are above $V_{TSP}$, but usually before the $V_T$'s reach the point at which charge build-up on the floating gates prevents the injection of more charge. This is done to make programming time as short as is reasonably possible.

FIG. 6C illustrates an erase sequence for the above-described array. This erasure scheme is the subject of claims contained in co-pending U.S. patent application Ser. No. 947,213, which is assigned to the assignee of the present invention. In response to the assertion of the ERASE control signal, logic 51 first decodes the address. In the case of the preferred embodiment organization described above, an erase line selection must be made in addition to the usual row and column selections. This requires no additional logic since the erase line selection is performed by the same logic (the Y-decoder) as the column selection. This selection is avoided if only row-at-a-time erasing is performed, in which case all erase lines may be treated identically, or there will be only one erase line.

Prior to erasing the selected byte, it must first be programmed, so that all of the cells have a high $V_T$. A program sequence is executed with each bit line in the selected column set to $V_{PP}$. In addition, the program voltages are advantageously held for a longer than usual time so that the cells tend to reach or approach the self-limiting value of $V_T$. This decreases the spread in threshold voltages ($\sim V_T$) which is the natural result of variations in properties and history among the cells. Next, all bit lines are allowed to float, or assume an undetermined voltage and a high input impedance. The "associated word line", which is the word line which shares a common source/erase line with the selected word line, is set to $V_{PP}$. In the case of word line i, the associated word line is i+1. All other word lines, including the selected word line, are set to $V_{SS}$. The selected erase line, j, is set to $V_{PP}$.

Once the erase voltages have been set up as described, each cell along the selected row has a low voltage on the control gate and a high voltage on the source, which encourages the tunneling of electrons off of the floating gate toward the source, through the tunneling oxide area, thus tending to lower the threshold of the cell. This condition is maintained for a predetermined, but very short, time. The hold time is selected in light of the programming characteristics of the particular cells, but is advantageously sufficient to alter the $V_T$'s no more than one-quarter to one-half volt. For instance, the hold time may be approximately 10 to 100 microseconds.

Following the erase pulse, the selected byte is read according to the sequence described above. If any bits still read as programmed, then another erase pulse will be executed. If no cell reads as programmed, then the sequence will be terminated. Using this erase sequence depends upon a sufficient margin between $V_{TSP}$ and the point at which a cell has a negative threshold voltage to ensure that when the "last" cell in the selected byte is erased the "first" cell will not yet have acquired a negative $V_T$. For example, in a fairly typical static array, the expected threshold voltage spread, $\sim V_T$, may be approximately 1 volt, $V_{TSP}$ may be approximately 3 volts, and the erase pulse length may be chosen to alter $V_T$ no more than 0.5 volts per pulse, and one would expect the array to function properly. In other words, when the "last" cell's $V_T$ falls below $V_{TSP}$, the "first" cell's $V_T$ would be no lower than approximately $V_{TSP}$ minus $\sim V_T$, or 2 volts. Since at least four more erase pulses would be necessary to drive the $V_T$ of the "first" cell negative, a sufficient margin is present. Trading off such design parameters to achieve a stable result is a familiar role for designers and need not be further illustrated here.

At least one alternate method of erasing single transistor EEPROM cells while avoiding over-erasure exists. In this alternate method, the read sequence following each erase pulse is altered by leaving all word lines at approximately $V_{SS}$. Thus, any cell which reads as erased has a $V_T$ of zero or less. A further modification or the read sequence is performed by slightly altering the bias of the sense amplifiers so that a cell reads as erased with a slightly higher $V_T$ than is the case with normal sense amplifier biasing. This assures that the "first" cell will be detected as erased while its threshold (with the control gate grounded) is still slightly positive. In this alternate method, the erase sequence is terminated when the "first" cell reads as erased, depending on the margins discussed above to assure that the $V_T$ of the last cell is below $V_{TSP}$.

No doubt, other erase sequences and variations are possible which rely on the principle of performing multiple, short erase pulses with intervening read sequences for the purpose of terminating the erase sequence before any cell in the selected byte (or word, or entire array) has acquired a negative $V_T$. Such a scheme is one way to make practical the use of single transistor EEPROM cells. In addition, since the user need not tolerate a uniform erase time chosen to ensure erasure of the "worst case" cell, many erase sequences will be shorter than with prior art EEPROM arrays.

An EEPROM cell and array have been disclosed which offer a number of significant advantages over previous such cells and arrays. The cell is a true single transistor EEPROM cell and uses only manufacturing techniques which are familiar in the semiconductor industry. The disclosed cell offers significantly higher density than previous EEPROM cells. The array disclosed is efficiently organized to provide the capability of row and/or single byte erasing, thus offering speed advantages over EEPROM arrays which must be bulk erased in order to change stored values in any particular byte. In addition, the disclosed array and method of erasure, which prevents over-erasure rather than compensating for its effects, offers the possibility of faster and more reliable operation.

While the present invention has been particularly shown and described with reference to a particular embodiment thereof, various modifications and changes thereto will be apparent to one skilled in the art and are within the spirit and scope of the present invention.

We claim:

1. An EEPROM array comprising a plurality of EEPROM cells each having a source, a drain, a floating gate, a control gate and tunnel means for selectively providing a tunneling path between said floating gate and said source, said array further comprising:
   a first subset of said plurality of EEPROM cells, each of said first subset of cells sharing a first common source and a first common control gate;
   a second subset of said plurality of EEPROM cells, each of said second subset of cells sharing said first common source and a second common control gate;
   a first erase select transistor having a source coupled to said first common source, a gate coupled to said first common gate, and a drain coupled to an erase conductor; and
   a second erase select transistor having a source coupled to said first common source, a gate coupled to said second common control gate and a drain coupled to said erase conductor.

2. An EEPROM array according to claim 1 wherein said first and second subsets of said plurality of EEPROM cells comprise first and second rows of said array.

3. An EEPROM array according to claim 1 wherein:
   said first erase select transistor shares said first common source and said first common control gate; and
   said second erase select transistor shares said first common source and said second common control gate.

* * * * *